United States Patent [19]

Ito et al.

[11] Patent Number: 4,491,628

[45] Date of Patent: Jan. 1, 1985

[54] POSITIVE- AND NEGATIVE-WORKING RESIST COMPOSITIONS WITH ACID GENERATING PHOTOINITIATOR AND POLYMER WITH ACID LABILE GROUPS PENDANT FROM POLYMER BACKBONE

[75] Inventors: Hiroshi Ito; Carlton G. Willson, both of San Jose, Calif.; Jean M. J. Frechet, Ottawa, Canada

[73] Assignee: International Business Machines Corporation, Armonk, N.Y.

[21] Appl. No.: 410,201

[22] Filed: Aug. 23, 1982

[51] Int. Cl.³ .......................... G03C 1/60; G03C 1/68
[52] U.S. Cl. .................................... 430/176; 430/270; 430/280; 430/281; 430/285; 430/286; 430/325; 430/326; 430/908; 430/910; 430/914
[58] Field of Search ............... 430/270, 281, 286, 325, 430/326, 176, 190, 192, 908, 910, 285, 280

[56] References Cited

U.S. PATENT DOCUMENTS

| | | | |
|---|---|---|---|
| 3,515,552 | 6/1970 | Smith | 430/325 |
| 3,536,489 | 10/1970 | Smith | 430/270 |
| 3,779,778 | 12/1973 | Smith et al. | 430/270 |
| 3,859,099 | 1/1975 | Petropoulos et al. | 430/190 |
| 3,984,253 | 10/1976 | Nelson | 96/35.1 |
| 4,104,070 | 8/1978 | Moritz et al. | 96/36 |
| 4,193,799 | 3/1980 | Crivello | 430/281 |
| 4,210,449 | 7/1980 | Schlesinger et al. | 430/183 |
| 4,250,053 | 2/1981 | Smith | 430/281 |
| 4,273,668 | 6/1981 | Crivello | 252/182 |
| 4,311,782 | 1/1982 | Buhr et al. | 430/270 |
| 4,405,708 | 9/1983 | Van Pelt et al. | 430/281 |

FOREIGN PATENT DOCUMENTS

| | | | |
|---|---|---|---|
| 53-81116 | 7/1978 | Japan | 430/270 |
| 56-29232 | 3/1981 | Japan | 430/270 |

*Primary Examiner*—Charles L. Bowers, Jr.
*Attorney, Agent, or Firm*—Joseph G. Walsh

[57] ABSTRACT

Resists sensitive to UV, electron beam and X-ray radiation with positive or negative tone upon proper choice of a developer are formulated from a polymer having recurrent pendant groups such as tert-butyl ester or tert-butyl carbonates that undergo efficient acidolysis with concomitant changes in polarity (solubility) together with a photoinitiator which generates acid upon radiolysis. A sensitizer component that alters wavelength sensitivity may also be added.

17 Claims, No Drawings

POSITIVE- AND NEGATIVE-WORKING RESIST COMPOSITIONS WITH ACID GENERATING PHOTOINITIATOR AND POLYMER WITH ACID LABILE GROUPS PENDANT FROM POLYMER BACKBONE

DESCRIPTION

1. Technical Field

The present invention is concerned with mixtures of certain polymers and cationic photoinitiators which are useful in resist compositions. In particular, it is concerned with mixtures useful because they can be made positive- or negative-working upon choice of a developer, and because they can be sensitized to various wavelengths ranging from deep UV to visible light. certain mixtures are further useful because of their resistance to plasma and reactive ion etching.

2. Background Art

Cationic photopolymerization of vinyl and heterocyclic monomers, and photocrosslinking of polymers containing oxirane and thirane rings initiated by an acid generated via photolysis of onium salts are well known. U.S. Pat. Nos. 4,210,449 and 4,273,668 show the use of the onium salts as photoinitiators for cationic polymerization and crosslinking.

U.S. Pat. No. 3,984,253 shows a sensitization of polyphthalaldehyde to UV, electron beam, and X-ray radiations by adding acid-generating compounds such as diazonium salts to provide positive images.

U.S. Pat. No. 4,311,782 shows a radiation-sensitive mixture which contains an acid-forming compound and a polymeric compound having recurrent orthocarboxylic acid ester groupings for the production of positive relief images.

U.S. Pat. No. 4,104,070 describes a Modified Image Reversal Process (MIRP). The process, however, requires the addition of a third component and a flood exposure step.

None of the prior art of which we are aware, however, shows the use of the particular polymers of the present invention or teaches the use of cationic photoinitiators to cleave the polymer pendant groups to change the structure of the recurrent units to such an extent as to make a great difference in the solubility characteristics of the exposed and unexposed regions of polymer films.

DISCLOSURE OF THE INVENTION

According to the present invention, resist compositions sensitive to ultraviolet (UV), electron beam or X-ray radiation with positive or negative resist tone upon proper choice of a developer are made by combining a polymer having recurrent acid labile pendant groups with a cationic photoinitiators such as aryldiazonium, diaryliodonium, or triarylsulfonium metal halides. The polymer containing the initiator is coated as a thin film on a substrate. It is then baked under controlled conditions, exposed to radiation in an imagewise configuration, and postbaked under controlled conditions. In the portions of the films on which the radiation falls, the polymer recurrent acid labile pendant groups are cleaved to form polar recurring units and the exposed areas are selectively removed by treatment with an alkaline developer or polar solvents. Because the unexposed portions of the film are nonpolar, they are selectively removed by treatment with a nonpolar solvent. Thus, image reversal is extremely easily achieved by proper choice of a developer owing to the great difference in the solubility characteristics of the exposed and unexposed portions. The mechanism of the dissolution differentiation involved in the present invention completely differs from those of the prior art above. Whereas the prior art depends on crosslinking in the case of the negative tone or main chain degradation in the case of the positive tone, the present invention is concerned with the side chain cleavage.

In a preferred variation of the present invention, the compositions employed are made sensitive to various wavelengths ranging from deep UV to visible light. For instance, the absorption maxima of aryldiazonium salts can be matched to the spectrum of the mercury lamp output by substitution on the aromatic ring. In addition, although the absorption of diaryliodonium and triarylsulfonium salts does not extend about 300 nm, simple addition of an additional sensitizer component allows patterning at longer wavelengths ranging from mid UV to visible light.

Compositions covered under the present invention which contain recurring aromatic rings have another desirable property, namely, resistance to plasma and reactive ion etching.

Compositions of the present invention containing diaryliodonium or triarylsulfonium metal halides are particularly useful and advantageous when used with deep UV light (200–300 nm) exposure, because they are very sensitive to deep UV light and give very high resolution images with nearly vertical wall angles even in films thicker than $2\mu$.

In the present invention, it is understood that any substance which produces strong acid upon exposure to radiation can be a photoinitiator. However, the most preferred photoinitiators are unsubstituted and symmetrically or unsymmetrically substituted diaryliodonium or triarylsulfonium salts. Triarylselenonium salts are also useful. Substituted aryldiazonium salts can be employed as well. The most preferable gegenanions of the salts in the present invention are complex metal halides such as tetrafluoroborate, hexafluoroantimonate, hexafluoroarsenate, and hexafluorophosphate, but the invention is not limited to these gegenanions and photoinitiators. It is operative with a wide range of compounds which generate acids upon exposure to radiation. In the present invention, the amount of initiator used ranges from 1 to 100 w/w % to polymer. The preferred concentration range is from 5 to 50 w/w %.

The preferred polymers of the present invention are vinylic polymers containing recurrent pendant groups that undergo efficient acidolysis to produce products that are very different in polarity (Solubility) than their precursors. The invention, however, is not limited to polymers obtained by vinylic addition polymerization. Other polymerizations such as condensation, polyaddition, and addition condensation can be employed to synthesize polymers useful in the present invention.

The preferred acid labile pendant groups are tert-butyl esters of carboxylic acides and tert-butyl carbonates of phenols but, it is understood that a wide range of acid labile groups are operative in the invention. These include trityl, benzyl, benzyhdryl modifications as well as others well known in the art.

The most preferred polymers are poly(p-tert-butoxycarbonyloxy-α-methylstyrene), poly(p-tert-butoxycarbonyloxystyrene), poly(tert-butyl p-vinylbenzoate), poly(tert-butyl p-isopropenylphenyloxyacetate), and poly(tert-butyl methacrylate).

The preferred compounds used with diaryliodonium or triarylsulfonium salts to sensitize the compositions to longer wavelengths ranging from mid UV to visible light are polycyclic aromatics such as pyrene and perylene. Other dyes are also available that are operative sensitizers including the acridines. The invention is not limited to the use of any particular class of dyes.

BEST MODE FOR CARRYING OUT THE INVENTION

The following synthetic procedures describe the preferred method for making the preferred polymers. The synthesis of the photoinitiators has been well documented in the literature. The following procedure also describes the preferred process for using the present invention.

A. Preparation of p-tert-Butoxycarbonyloxy-α-methylstyrene

A-1

A solution of 5.44 g of p-hydroxyacetophenone in 150 mL of dry tetrahydrofuran was treated with 4.48 g of potassium tert-butoxide. To the mixture were then added 10.02 g of di-tert-butyl dicarbonate in tetrahydrofuran. After stirring for one hour at room temperature, the reaction was poured into cold water, and the resulting mixture was extracted with ethyl acetate. After a standard work-up procedure, the solution was concentrated and the product crystallized on standing at room temperature (9.2 g, 97% yield). A suspension of 3.57 g of methyltriphenylphosphonium bromide in 50 mL of dry tetrahydrofuran was treated with 1.12 g of potassium tert-butoxide. After stirring for 30 minures, 2.36 g of p-tert-butoxycarbonyloxyacetophenone in 20 mL of tetrahydrofuran were added. After the work-up procedure, the organic layer was concentrated to yield a viscous material which was purified by high pressure liquid chromatography using hexane as eluent to give 1.55 g (66%) of pure p-tert-butoxycarbonyloxy-α-methylstyrene.

A-2

A mixture of 5.64 g of p-hydroxy-α-methylstyrene, synthesized by base-catalyzed cleavage of 2,2-bis(p-hydroxyphenyl)propane, and 6.5 g of potassium tert-butoxide in 50 mL of dry tetrahydrofuran was stirred for 10 minutes, then a tetrahydrofuran solution of 12.7 g of di-tert-butyl dicarbonare was added. The resulting gelatinous mixture was mechanically stirred for 20 minutes, and then poured into cold water. After work-up, a crude product was obtained by evaporation of the extraction solvent (ethyl acetate). Purification was achieved by high pressure liquid chromatography with hexane as eluent to give 8.03 g (81%) of the pure p-tert-butoxycarbonyloxy-α-methylstyrene.

B. Preparation of p-tert-Butoxycarbonyloxystyrene

A solution of 21.7 g of p-hydroxybenzaldehyde in dry THF was treated with 19.94 g of potassium t-butoxide under a nitrogen atmosphere. After stirring for a few minutes at room temperature, 42.8 g of di-t-butyl dicarbonate were added and the mixture was stirred for another hour at room temperature. Thin layer chromatography showed that the reaction was complete and the mixture was poured into ice water. The product was extracted with ethyl acetate, washed with water and dried over magnesium sulfate. Evaporation of the solvent afforded 39 g (99%) of a crude material which can be used directly for the preparation of p-t-butoxycarbonyloxystyrene. Alternately, the product was purified by preparative HPLC to afford the pure material, p-t-butoxycarbonyloxybenzaldehyde.

A suspension of 34.1 g of methylriphenylphosphonium bromide in 400 mL of dry THF was treated with 10.7 g of potassium t-butoxide under a nitrogen atmosphere. After stirring for 10 min at room temperature, the yellow solution was treated with a solution of 21.2 g of p-t-butoxycarbonyloxybenzaldehyde in 100 mL of dry THF. After stirring for one hour, the mixture was poured into cold water and extracted with ethyl acetate. The organic phase was washed, dried over magnesium sulfate and concentrated. The crude product was purified by preparative HPLC to yield 16.6 g (79%) of pure p-t-butoxycarbonyloxystyrene. Alternately, IIIc was purified by distillation under reduced pressure.

C. Preparation of p-t-Buxtoxycarbonyloxystyrene p-tert-Butoxycarbonyloxy-α-methylstyrene (3.000 g) was dried under high vacuum and dissolved in 10.0 mL of dry liquid sulfur dioxide distilled in vacuo into the polymerization ampoule to give a yellow solution. With the monomer solution frozen at liquid nitrogen temperature, boron trifluoride etherate (0.02 mL, 1.2 mole % to the monomer) was introduced by distillation in vacuo. Upon thawing at −65° C., the mixture became turbid, and after one hour at −65° C., a phase separation was observed. Then, almost the whole mass solidified. After 26 hours, the ampoule was cut open and cold methanol was added at −65° C. to provide the polymer as a white precipitate. The polymer was dissolved in dichloromethane, precipitated in methanol, purified by reprecipitation in methanol, and dried in vacuo at 38° C. to provide 2.614 g (87.1%) of product with number average molecular weight of 46,900 (membrane osometry).

D. Preparation of Poly(p-tert-butoxycarbonyloxystyrene)

D-1

Commercial poly(p-vinylphenol) was reacted under phase transfer conditions with di-tert-butyl dicarbonate and sodium carbonate. The resulting polymer was isolated from the organic phase by precipitation to provide greater than 90% yield of product showing the characteristic carbonyl absorbance of aryl alkyl carbonates.

D-2. Free Radical Polymerization of p-t-butoxycarbonyloxystyrene

A solution of 5 g of p-t-butoxycarbonyloxystyrene in 5 mL of toluene containing 0.03 g of AIBN was heated to 65°–75° under nitrogen. The mixture became very viscous overnight and, after being diluted with dichloromethane, the polymer was precipitated in petroleum ether. The white solid was washed with petroleum ether, then with methanol and dried. The polymer weighed 4.1 g (82% yield) and has Mn=43,000 (osmometry).

D-3. Cationic Polymerization of p-t-butoxycarbonyloxystyrene p-tert-Butoxycarbonyloxystyrene (1.000 g) was dried under high vacuum and dissolved in 3.0 mL of dry liquid sulfur dioxide distilled in vacuo into the polymerization ampoule to give a yellow solution. With the solution frozen at liquid nitrogen temperature, boron trifluoride etherate (5 μL, 0.8 mole % to the monomer) was introduced by distillation in vacuo. The polymerization was carried out at −65° C. for 27 hours. The ampoule was cut open and cold methanol was added at −65° C. to provide the polymer as a white precipitate. The polymer was dissolved in chloroform, precipitated in methanol, purified by reprecipitation in methanol, and dried at 40° C. to provide 0.901 g (90.1%) of product with number average molecular weight of 28,900 (GPC).

E. Preparation of Resist Solution, Exposure and Development

In a typical experiment, the polymer is dissolved in diglyme or cyclohenanone at 20 w/v % of solids, to which is added the onium salt at 20 w/w % to the polymer.

The solution is filtered through a 0.2μ teflon filter. A resist layer is formed from the solution by spin coating onto a silicon wafer. The coated film is baked at 90°–100° C. for 30 minutes.

The films are then exposed through a quartz mask to UV radiation from an Oriel illuminator or a Hybrid Technology Group Model 345-10 Xe-Hg lamp, imagewise exposed to 25 KeV scanning electron beam radiation or to X-radiation.

The exposed films are heated at 90°–100° C. for 5–15 seconds.

The exposed and heated films are then developed in agueous base or alcohol to provide high resolution *positive* tone images without loss of film thickness in the unexposed regions.

The system can be easily made *negative*-working by development in a nonpolar solvent such a dichloromethane or mixtures of hexane and dichloromethane after exposure and baking.

The sensitization to the longer wavelengths can be achieved by adding a small amount of pyrene or perylene to the resist solution above. Pyrene is effective to render the resist compositions containing diphenylliodonium salts sensitive to 313 nm radiation. Perylene is effective to render the resist compositions containing diphenyliodonium or triphenylsulfonium salts sensitive to 365, 404 and 436 nm radiation.

F. EXAMPLES

EXAMPLE 1

Poly(p-tert-butoxycarbonyloxy-α-methylstyrene) (number average molecular weight 46,900) was dissolved in diglyme at 20 w/v % of solids. Triphenylsulfonium hexafluoroarsenate was added at a loading of 20 w/w % to the polymer. The resist film was spin coated from the solution onto silicon wafers at 3000 rpm to form a 0.6μ thick layer. The film was baked at 100° C. for 30 minutes, and then exposed through a quartz mask to UV radiation at a dose of 5–10 mJ/cm². After postbaking at 100° C. for 5 seconds, high resolution positive images were obtained by development in agueous base for 60 seconds. Similarly, negative images were obtained by development in dichloromethane/hexane for 5–10 seconds.

EXAMPLE 2

Poly(p-tert-butoxycarbonyloxy-α-methylstryene) (number average molecular weight of 46,900) was dissolved in cyclohexanone at 30 w/v % of solids. Triphenylsulfonium hexafluoroarsenate was added at a loading of 20 w/w % to the polymer. The resist film was spin coated from the filtered solution onto the silicon wafer at 2000 rpm to give a 2.4μ thick layer. The film was baked at 100° C. for 30 minutes, and then exposed through a quartz mask to narrow band width 254 nm UV radiation at a dose of 50 mJ/cm². The exposed film was postbaked at 100° C. for 15 seconds. High resolution positive images with nearly vertical wall angles were obtained by development in isopropanol for 30 seconds. Negative images were also obtained by development in dichloromethane for 30 seconds.

EXAMPLE 3

Poly(p-tert-butoxycarbonyloxystyrene) (number average molecular weight of 21,600) was dissolved in a mixture of 1,1,2,2-tetrachloroethane and diglyme (5:1) at 3 w/v % of solids. Diphenyliodonium hexafluoroarsenate (20 w/w % to the polymer) and a small amount of perylene were added to the polymer solution. A one μ thick film was cast from the solution onto a quartz wafer by spin coating at 2500 rpm. The film was baked at 100° C. for 10 minutes, and exposed to narrow bandwidth 365 nm radiation at a dose of 25 mJ/cm². After postbaking at 100° C. for 2 minutes, the side groups were confirmed to be completely cleaved by UV and IR spectroscopy.

EXAMPLE 4

Poly(p-tert-butoxycarbonyloxy-α-methylstyrene) (number average molecular weight of 46,900) was dissolved in diglyme at 20 w/v % of solids. Triphenylsulfonium hexafluoroarsenate (20 w/w % to the polymer) was added. The resist film was spin coated from the solution onto a silicon wafer at 3000 rpm to give a 0.6μ thick layer. The film was baked at 100° C. for 30 minutes, and then exposed to 25 KeV scanning electron beam radiation at incident doses of 50, 20, 10, and 5 μC/cm² to provide 4.0 to 0.25μ lines. The exposed film was postbaked at 100° C. for 5 seconds, and developed in isopropanol to provide high resolution positive images. The image quality is good at 10 μC/cm².

EXAMPLE 5

Poly(tert-butyl methacrylate) synthesized by radical polymerization was dissolved in diglyme at 20 w/v % of solids. Triphenylsulfonium hexafluoroarsenate was added at a loading of 20 w/w % to the polymer. The resist film was cast from the solution on a silicon wafer by spin coating at 3000 rpm to give a 0.6μ thick layer. The film was baked at 100° C. for 30 minutes, and exposed through a quartz mask to UV radiation at a dose of 55 mJ/cm². The exposed film was postbaked at 100° C. for 20 seconds and developed in dichloromethane for 30 seconds to provide high resolution negative images.

We claim:

1. A resist composition comprising:
   a polymer and a photoinitiator which generates an acid upon exposure to radiation, the photoinitiator being present in from 1% to 100% by weight of said polymer, and the polymer having acid labile groups pendant from the polymer backbone, said groups being tertiary butyl esters of carboxylic acids or tertiary butyl carbonates of phenols, and said resist composition being positive working when developed with alkaline developer or polar solvent to remove exposed areas of the composition and negative working when developed with a nonpolar solvent to remove unexposed areas of the composition.

2. A resist composition as claimed in claim 1 which also contains a sensitizer that absorbs radiation and transfers energy to the photoinitiator.

3. A resist composition as described in claim 1 wherein the acid labile pendant groups are tert-butyl esters of carboxylic acids.

4. A resist composition as described in claim 1 wherein the acid labile pendant groups are tert-butyl-carbonates of phenols.

5. A resist composition as claimed in claim 1 wherein the polymer is a poly (tert-butyloxycarbonyloxy-$\alpha$-alkylstyrene) or a copolymer thereof.

6. A resist composition as claimed in claim 1 wherein the polymer is a poly (p-tert-butyloxycarbonyloxy-$\alpha$-methylstyrene) or a copolymer thereof.

7. A resist composition as claimed in claim 1 wherein the polymer is a poly (tert-butyloxycarbonyloxystyrene) or copolymer thereof.

8. A resist composition as claimed in claim 1 wherein the polymer is a poly (p-tert-butyloxycarbonyloxy-styrene) or a copolymer thereof.

9. A resist composition as claimed in claim 1 wherein the polymer is a poly (tert-butyl vinylbenzoate) or a copolymer thereof.

10. A resist composition as claimed in claim 1 wherein the polymer is a poly (tert-butylmethacrylate) or a copolymer thereof.

11. A resist composition as claimed in claim 1 wherein the photoinitiator is an aryl diazonium salt.

12. A resist composition as claimed in claim 1 wherein the photoinitiator is an diaryliodonium salt.

13. A resist composition as claimed in claim 1 wherein the photoinitiator is triarylsulfonium salt.

14. A resist composition as claimed in claim 2 wherein the sensitizer is a dye.

15. A resist composition as claimed in claim 2 wherein the sensitizer is a polycyclic aromatic compound.

16. A resist composition as claimed in claim 2 wherein the sensitizer is pyrene.

17. A resist composition as claimed in claim 2 wherein the sensitizer is perylene.

* * * * *